United States Patent
Lacroix

(10) Patent No.: US 10,283,419 B2
(45) Date of Patent: May 7, 2019

(54) METHOD AND APPARATUS FOR MEASURING SURFACE PROFILE

(71) Applicant: YSYSTEMS, LTD., Tokushima (JP)

(72) Inventor: Yves Lacroix, Tokushima (JP)

(73) Assignee: YSYSTEMS, LTD., Tokushima-Shi (JP)

( * ) Notice: Subject to any disclaimer, the term of this patent is extended or adjusted under 35 U.S.C. 154(b) by 0 days.

(21) Appl. No.: 15/329,548

(22) PCT Filed: Jul. 30, 2014

(86) PCT No.: PCT/JP2014/070114
§ 371 (c)(1),
(2) Date: Jan. 26, 2017

(87) PCT Pub. No.: WO2016/016972
PCT Pub. Date: Feb. 4, 2016

(65) Prior Publication Data
US 2017/0221776 A1    Aug. 3, 2017

(51) Int. Cl.
*G01B 11/00*    (2006.01)
*H01L 21/66*    (2006.01)
*G01B 11/24*    (2006.01)

(52) U.S. Cl.
CPC .............. *H01L 22/12* (2013.01); *G01B 11/24* (2013.01)

(58) Field of Classification Search
None
See application file for complete search history.

(56) References Cited

U.S. PATENT DOCUMENTS

| 4,332,477 A * | 6/1982 | Sato | G01B 11/306 |
| | | | 356/613 |
| 4,452,534 A * | 6/1984 | Gribanov | G01B 11/2441 |
| | | | 356/513 |

(Continued)

FOREIGN PATENT DOCUMENTS

| JP | 6-026842 A | 2/1994 |
| JP | 7-234116 A | 5/1995 |

(Continued)

OTHER PUBLICATIONS

Summary of the ISR-372 and International Search Report and Written Opinion received in PCT Application No. PCT/JP2014/070114 dated Sep. 9, 2014.

(Continued)

*Primary Examiner* — Shawn Decenzo
*Assistant Examiner* — Jarreas C Underwood
(74) *Attorney, Agent, or Firm* — Brinks Gilson & Lione

(57) ABSTRACT

An object is to provide a method and apparatus for measuring a surface profile that enable correction or the like of the surface profile through measuring the surface profile of a semiconductor layer when forming the semiconductor layer by a vapor deposition method. A single laser beam is reflected by a movable mirror to generate incident laser beams (Ld1, Ld2 and Ld3) separated substantially into three beams, and incident points (P1, P2 and P3) on the surface of a semiconductor layer (7) being formed in a chamber (2) are irradiated with the incident laser beams (Ld1, Ld2 and Ld3). A beam position sensor detects reflected laser beams (Lv1, Lv2 and Lv3) from the irradiation points (P1, P2 and P3) thereby to measure the surface profile of a film that includes the incident points (P1, P2 and P3).

10 Claims, 5 Drawing Sheets

(56) References Cited

U.S. PATENT DOCUMENTS

| | | | | |
|---|---|---|---|---|
| 4,494,874 A * | 1/1985 | DiMatteo | ............... | G01B 11/24 250/205 |
| 5,912,738 A * | 6/1999 | Chason | ............... | G01B 11/255 356/601 |
| 7,196,801 B1 * | 3/2007 | Janik | ............... | G01B 11/306 356/606 |
| 7,505,150 B2 * | 3/2009 | Zettler | ............... | G01B 11/24 356/601 |
| 7,570,368 B2 | 8/2009 | Belousov et al. | | |
| 8,310,686 B2 * | 11/2012 | Morris | ............... | G01B 11/24 356/630 |
| 8,326,573 B2 * | 12/2012 | Jackson | ............... | G01B 21/20 702/167 |
| 8,514,408 B2 * | 8/2013 | Zettler | ............... | G01B 11/25 356/612 |
| 9,523,572 B2 * | 12/2016 | Chen | ............... | G01B 11/2513 |
| 9,551,569 B2 * | 1/2017 | Wu | ............... | G01B 11/16 |
| 9,651,367 B2 * | 5/2017 | Akita | ............... | G01B 11/24 |
| 2008/0186512 A1 * | 8/2008 | Kee | ............... | G01B 11/25 356/610 |
| 2013/0235387 A1 | 9/2013 | Kim | | |
| 2013/0301096 A1 | 11/2013 | Takahashi | | |

FOREIGN PATENT DOCUMENTS

| | | |
|---|---|---|
| JP | 8-045922 A | 2/1996 |
| JP | 9-126913 A | 5/1997 |
| WO | WO 2014/016995 A1 | 1/2014 |
| WO | WO2016/016972 A1 | 2/2016 |

OTHER PUBLICATIONS

Extended European Search Report dated Feb. 2, 2018 for European Application No. 14898549.2, 11 pages.

* cited by examiner

METHOD AND APPARATUS FOR MEASURING SURFACE PROFILE

This application is a National Phase application of PCT International Application PCT/JP2014/070114, titled as "Method And Apparatus For Measuring Surface Profile", filed on Jul. 30, 2014, which is incorporated by reference in its entirety.

TECHNICAL FIELD

The present invention relates to a method and an apparatus for measuring the warpage or other similar parameters of the surface profile of a film such as a semiconductor layer when semiconductor elements such as a light-emitting diode and other semiconductor elements are formed by a vapor deposition method.

BACKGROUND ART

Semiconductors such as AlN, GaAs, GaN, InP, Si and SiC may be formed by a vapor deposition method. Examples of the vapor deposition method to be used include a chemical vapor deposition method (CVD method) and a molecular beam epitaxy method (MBE method). In such a vapor deposition method, a substrate is placed in an evacuated chamber and a film is formed such that raw material molecules are supplied in the form of a raw material gas or other appropriate form onto the substrate to deposit a crystal layer on the surface of the substrate.

In this kind of vapor deposition method, the temperature of the substrate in the chamber may have to be accurately controlled in order to densely form an impurity-free semiconductor crystal layer at a constant deposition rate in a reproducible manner. This will be described in detail. Material of the substrate and material of the film to be grown on the substrate surface may usually be different and an optimum temperature for the vapor deposition also differs depending on the composition of the film to be formed. It is therefore necessary to control the heater for heating the substrate to vary the substrate temperature in a planned manner during the film formation and finally bring back the substrate temperature to the ordinary temperature from the temperature suitable for the film formation.

However, internal stress may occur in the semiconductor layer and substrate due to the temperature variation of the substrate to cause a warpage of the semiconductor layer, rather than allowing the semiconductor layer to have a flat surface, in accordance with the combination of the materials used for the film formation, or distribution of the coefficient of thermal expansion in the film, or distribution of the thickness of the film formed on the surface of the substrate. If such a warpage occurs in the semiconductor layer and substrate, the semiconductor layer will crack when cooled after being formed and may possibly break. The film forming condition may therefore have to be controlled in real time so that the surface profile of the semiconductor layer remains flat as much as possible. This control may be performed through preparing a material in a gas state other than the raw material such as for the semiconductor layer and mixing them to be supplied onto the substrate, thereby giving stress to generate bending force opposite to the warpage direction.

Patent Literature 1 below discloses a technique for measuring the surface profile of a semiconductor layer. Specifically, a certain point of the surface of a semiconductor layer is irradiated with a single laser beam of which the irradiation direction is fixed, and the reflected beam from that point is detected using a beam position sensor (PSD: Position Sensitive Detector). The detected position (direction) of the reflected beam is used as the basis to calculate the angle of the surface.

In the invention as disclosed in Patent Literature 1, only one point can be irradiated with the laser beam if the semiconductor layer is in a stationary state, because the irradiation direction of the single laser beam is fixed. Accordingly, the semiconductor layer is rotated to move so that a plurality of points on the surface of the semiconductor layer is irradiated with the laser beam, and the angle can thus be detected at each of the plurality of points on the surface of the film.

When the single laser beam with the fixed irradiation direction is used, however, the amount of information is too small to accurately perceive the surface profile of the film. In addition, it is difficult to accurately perceive the curvature and other necessary parameters within a limited region because the laser beam is difficult to be given to a plurality of incident points within such a limited region.

Moreover, when the film such as a semiconductor layer is in a stationary state or rotates around its axis while only one point is irradiated with the laser beam, if the irradiated point by the laser beam is located at the top of a warpage, the reflection effect of the laser beam is the same as that when the irradiated point is located on a flat surface. Thus, the warpage of the film cannot be accurately measured.

If a plurality of laser beams is given to a plurality of incident points on the surface of a film, the amount of information for measuring the surface profile of the film will increase. In this case, however, the number of components of the apparatus is unduly large because a plurality of light-emitting devices has to be used.

PRIOR ART LITERATURE

Patent Literature

[Patent Literature 1] U.S. Pat. No. 7,570,368B

SUMMARY OF THE INVENTION

Problems to be Solved by the Invention

The present invention has been made to solve the above problems of the prior art and an object of the present invention is to provide a method and an apparatus for measuring a surface profile with which, when a film such as a semiconductor layer is formed using a vapor deposition method, the surface profile of the film can be accurately detected and the semiconductor film or other desirable films can be formed with high quality.

Another object of the present invention is to provide a method and an apparatus for measuring a surface profile with which, even when a semiconductor layer is in a stationary state without motion such as rotative motion, the surface profile including the irradiation points on the film such as semiconductor layer can be accurately detected and the semiconductor film or other desirable films can be formed with high quality.

Means for Solving the Problems

According to a first aspect of the present invention, there is provided a method for measuring a surface profile of a film growing on a surface of a substrate in a chamber, the method being characterized by comprising: successively or intermittently varying an angle of a mirror at a high speed so that the mirror gives a single laser beam to a plurality of irradiation points around a certain point on a surface of the film while varying an incident direction of the laser beam; detecting a reflection direction of the laser beam using a beam position sensor to obtain detection information; and measuring a warpage of the surface at the certain point from the detection information.

In the method for measuring a surface profile according to the present invention, an inclination of the surface at each of the irradiation points may be detected from the laser beam reflected from each of the irradiation points and the warpage may be measured from the inclination.

In the method for measuring a surface profile according to the present invention, an irradiation timing of the laser beam and a reflection angle of the mirror can be controlled at a high speed to vary the incident direction of the laser beam to the surface of the film.

In the method for measuring a surface profile according to the present invention, an angle of the mirror may preferably be controlled to vary a relative angle of the incident direction of the laser beam given to each of the irradiation points. In this case, the relative angle may preferably be varied in accordance with the measured warpage of the surface of the film.

In the method for measuring a surface profile according to the present invention, an angle of the mirror may preferably be controlled to vary an incident angle toward the certain point so that the beam position sensor can receive all of the laser beams reflected from the irradiation points.

In the method for measuring a surface profile according to the present invention, the mirror may comprise a first mirror and a second mirror that are configured to direct the laser beam toward the surface of the film, wherein the first mirror may give the laser beam to the irradiation points around the certain point and the second mirror may vary the incident angle toward the certain point.

In the method for measuring a surface profile according to the present invention. the irradiation points may preferably comprise three or more irradiation points.

According to a second aspect of the present invention, there is provided an apparatus for measuring a surface profile of a film growing on a surface of a substrate in a chamber, the apparatus being characterized by comprising: a light-emitting device configured to give a single laser beam; a mirror configured to reflect the laser beam toward the surface of the film; and a drive unit configured to vary a reflection direction of the mirror, wherein an angle of the mirror is successively or intermittently varied at a high speed so that the mirror gives the single laser beam to a plurality of irradiation points around a certain point on a surface of the film while varying an incident direction of the laser beam, wherein the apparatus further comprises a beam position sensor disposed on optical paths of laser beams reflected from respective incident points, wherein the beam position sensor detects reflection directions of the laser beams to obtain detection information and a warpage of the surface at the certain point is measured from the detection information.

In the apparatus for measuring a surface profile according to the present invention, preferably, the light-emitting device and the mirror may be provided outside the chamber, wherein the laser beam may transmit through a window provided on the chamber and may be given to inside of the chamber and the reflected laser beam may transmit through a window also provided on the chamber and may be detected by the beam position sensor provided outside the chamber.

Effect of the Invention

According to the method for measuring a surface profile of the present invention, the reflection direction of the single laser beam is varied thereby to allow the plurality of incident points on the surface of the film to be irradiated in turn with the incident laser beam, and the surface profile of the film can thus be finely analyzed by detecting points that receive the reflected laser beams from the plurality of incident points. Moreover, the surface profile of the film can be analyzed even when the substrate is in a stationary state.

In the apparatus for measuring a surface profile according to the present invention, all of the components can be disposed outside the chamber of the film forming apparatus thereby to enable to perceive the surface profile of the film without affecting the film formation in the chamber.

EMBODIMENTS FOR CARRYING OUT THE INVENTION

Figure 1:
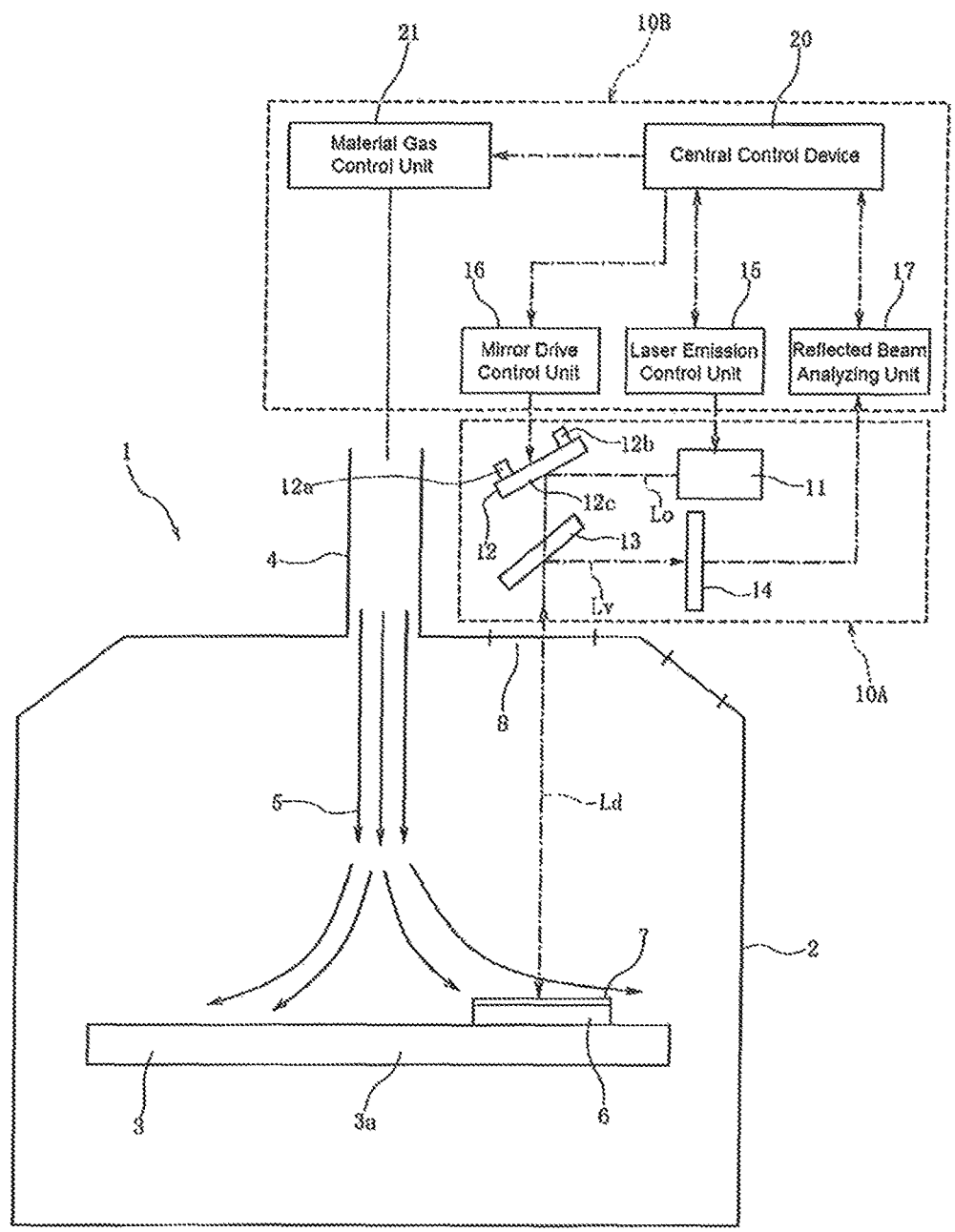
FIG. 1 is an explanatory view illustrating the schematic configuration of a film forming apparatus and a measurement apparatus according to a first embodiment of the present invention.

FIG. 1 is an explanatory view illustrating a film forming apparatus 1 and a measurement apparatus 10 that is a first embodiment of the present invention.

In FIG. 1, the film forming apparatus 1, which forms a semiconductor layer by a chemical vapor deposition method (CVD method) or a molecular beam epitaxy method (MBE method), is illustrated in a schematic view.

The film forming apparatus 1 has a chamber 2 of which the interior space is evacuated during the film formation. The chamber 2 is provided therein with a table 3, which incorporates a heater 3a as a heating device. The chamber 2 is connected to a feeding path 4, from which a gas 5 is given to the surface of the table 3 to form a semiconductor layer 7 on the surface of a substrate 6 disposed on the table 3. The gas 5 is a mixture of the raw material gas, which contains elements (raw material molecules) for forming the semiconductor layer 7, and other material gases. Examples of the substrate 6 include a Si (silicon) substrate and sapphire substrate.

The chamber 2 is provided with a first window 8 and a second window 9. Transparent plates such as glass plates are fitted in the first window 8 and second window 9, so that the inside can be observed through the transparent plates, but the interior space and exterior space of the chamber 2 are shielded from each other by the transparent plates.

A measurement apparatus 10A and a circuit unit 10B associated with the measurement apparatus 10A are provided outside the chamber 2. The circuit unit 10B comprises a central control device 20, which is composed of a microcomputer, memory and other necessary components, and other control units 15, 16, 17 and 21. In an alternative embodiment, functions of the control units 15, 16, 17 and 21 may be virtually realized in the central control device 20 in whole or in part.

The measurement apparatus 10A has a light-emitting device 11. The light-emitting device 11 is provided with a laser light source that emits a laser beam. The laser beam may be converted into a collimated beam by a collimator lens and given to the surface of the semiconductor layer 7 or may also be converged by a converging lens and focused on the surface of the semiconductor layer 7 to form a spot image on the surface of the semiconductor layer 7.

The laser beam emitted from the laser light source is given to a pivot mirror 12. The pivot mirror 12 is supported by drive units 12a and 12b that are composed of piezo elements and other necessary components. The pivot mirror 12 is successively or intermittently driven at a high speed by the drive units 12a and 12b to three-dimensionally vary the direction of a reflection surface 12c. The laser beam emitted from the light-emitting device 11 is reflected by the reflection surface 12c, transmits through a beam splitter 13, and is given to a certain incident point on the surface (film surface) of the semiconductor layer 7 which is being formed or has been formed in the chamber 2. When the film being grown is transparent, the incident point may be set on the surface of the substrate 6.

The reflected beam from the incident point on the surface of the semiconductor layer 7 returns to the beam splitter 13 at which the returned beam is reflected in a direction different from the direction toward the pivot mirror 12 and given to a beam position sensor 14.

In the description below, the "laser beam" emitted from the laser light source is denoted by L0, the "incident laser beam" given to the semiconductor layer 7 by the laser beam L0 reflected from the reflection surface 12c is denoted by Ld, and the "reflected laser beam" from the surface of the semiconductor layer 7 to return is denoted by Lv, so that they can be distinctly described.

The pivot mirror 12 and the beam splitter 13 are arranged in line outside the first window 8 and face the substrate 6 from just above via the transparent plate fitted in the first window 8. Both the incident laser beam Ld and the reflected laser beam Lv transmit through the first window 8.

In an alternative embodiment, as illustrated in FIG. 3 and subsequent figures, the measurement apparatus according to the present invention may not be provided with a beam splitter 13 while a pivot mirror 12 is disposed outside a first window 8 and a beam position sensor 14 is disposed outside a second window 9 that is provided on a chamber 2. In this case, the incident laser beam Ld transmits through the first window 8 and the reflected laser beam Lv transmits through the second window 9.

The circuit unit 10B is provided with a laser emission control unit 15, mirror drive control unit 16, reflected beam analyzing unit 17, and other appropriate units. The laser emission control unit 15 controls the emission timing of the laser beam in the light-emitting device 11. The mirror drive control unit 16 operates the drive units 12a and 12b to control the direction of the reflection surface 12c of the pivot mirror 12.

The beam position sensor 14 is a position sensitive detector (PSD). When the reflected laser beam Lv is received by the beam position sensor 14, the beam position sensor 14 detects the position of the beam receiving point. This positional detection output is given to the reflected beam analyzing unit 17, which then calculates the position of the beam receiving point on plane coordinates, and the calculated values are given to the central control device 20.

The central control device 20 is composed of a microcomputer, memory and other necessary components. The central control device 20 controls the laser emission control unit 15 and the mirror drive control unit 16 so that the emission timing of the laser beam L0 and the direction of the reflection surface 12c of the pivot mirror 12 are synchronously controlled.

The positional information, analyzed by the above reflected beam analyzing unit 17, of the beam receiving point on the plane ordinates is given to the central control device 20, which then calculates the inclination angle of the surface at the incident point on the semiconductor layer 7 irradiated with an incident laser beam Ld1, from the angle of the reflection surface 12c of the pivot mirror 12, that is, the incident direction (incident angle) of the incident laser beam Ld to the surface of the semiconductor layer 7 and the positional information of the beam receiving point analyzed by the reflected beam analyzing unit 17, that is, the reflection direction (reflection angle) of the reflected laser beam Lv. As will be described later, the incident point is set at each of a plurality of points, so the incident direction of the incident laser beam Ld to each incident point and the reflection direction of the reflected laser beam Lv from each incident point are analyzed to calculate the surface profile of the semiconductor layer 7, that is, the surface profile such as presence of a warpage and its curvature and a waved form and undulated form of the surface.

As illustrated in FIG. 1, material supply to the chamber 2 via the feeding path 4 is controlled by a material gas control unit 21. Commands from the central control device 20 are given to the material gas control unit 21, which then controls the type of a raw material gas that contains elements (raw material molecules) for forming the semiconductor layer 7, and its supply amount and supply pressure. After calculating the warpage or the like of the surface of the semiconductor layer 7, the central control device 20 performs correction control, such as by supplying a material other than the raw material for generating a warpage in a direction of canceling the measured warpage.

Description will now be made to a method of measuring the warpage or other similar parameters of a laminate of the substrate and film in accordance with the processing operation of the measurement apparatus 10A and circuit unit 10B which are configured as the above. A method will be described below, which uses the above measurement apparatus 10 to measure the surface profile of the semiconductor layer 7 during the film formation or after the film formation. As will be understood, when the film to be grown is transparent, the laser beam may be given to the surface of the substrate thereby to enable measurement of a warpage of the substrate.

FIG. 2 illustrates positions of incident points P1, P2 and P3 at which the surface of the semiconductor layer 7 is irradiated with the incident laser beam Ld, incident directions of incident laser beams Ld1, Ld2 and Ld3 toward the incident points P1, P2 and P3, and reflection directions of reflected laser beams Lv1, Lv2 and Lv3.

In the film forming apparatus 1, the raw material gas 5 is introduced into the chamber 2 in a state in which the table 3 and the substrate 6 are heated by the heater 3a, and the semiconductor layer 7 grows on the surface of the transparent substrate 6. The semiconductor layer 7 formed on the surface of the substrate 6 is to form a molecular layer of a light-emitting diode or other semiconductor elements and examples thereof include AlN, GaAs, GaN, InP Si, and SiC.

Figure 2A:
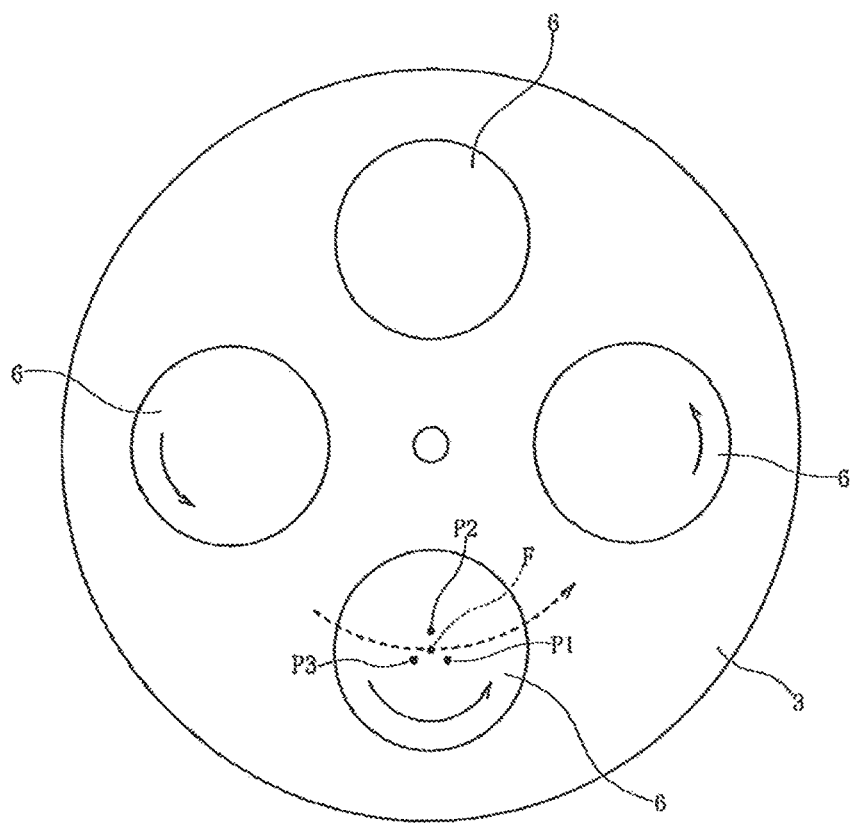
FIG. 2 is an explanatory view illustrating irradiation positions of laser beams incident on the surface of a semiconductor layer and reflection directions of laser beams reflected from the surface of the semiconductor layer.

As illustrated in FIG. 2(a), a plurality of substrates 6 is placed on the table 3. The table 3 is driven by a motor so as to be rotatable in the counterclockwise direction around the axis of the table 3. Each substrate 6 is also driven by a motor so as to be independently rotatable in the counterclockwise direction around the axis of the substrate 6 on the table 3.

When the measurement apparatus 10A starts the measurement, the laser emission control unit 15 controls the emission timing of the laser beam L0 in the light-emitting device 11 and, in synchronization with this, the mirror drive control unit 16 controls the direction of the reflection surface 12c of the pivot mirror 12. This control operation is successively or intermittently performed at a high speed and different irradiation points on the surface of the film are in turn irradiated with the laser beam L0 as the direction of the reflection surface 12c varies. In the embodiment of FIG. 2, the operation of the reflection surface 12c allows the laser beam L0 to be successively converted into substantially three incident laser beams: an incident laser beam Ld1 with which an incident point P1 on the surface of the semiconductor layer 7 is irradiated; an incident laser beam Ld2 with which an incident point P2 is irradiated; and an incident laser beam Ld3 with which an incident point P3 is irradiated. The surface of the semiconductor layer 7 may be irradiated once with each of the incident laser beams Ld1, Ld2 and Ld3 or may also be irradiated twice or more with the incident laser beams Ld1, Ld2 and Ld3 in this order in a cyclic manner.

In this control, a neutral position of the pivot mirror 12 is first determined, a certain point (point F of FIG. 2) on the film surface is then determined, and irradiation points are set around the certain point F by giving incident laser beams to the vicinity of the certain point F. The certain point F is a target point for determining an irradiation region for a plurality of irradiation points P1, P2 and P3, and the laser beam is not given to the certain point F.

Figure 2B:
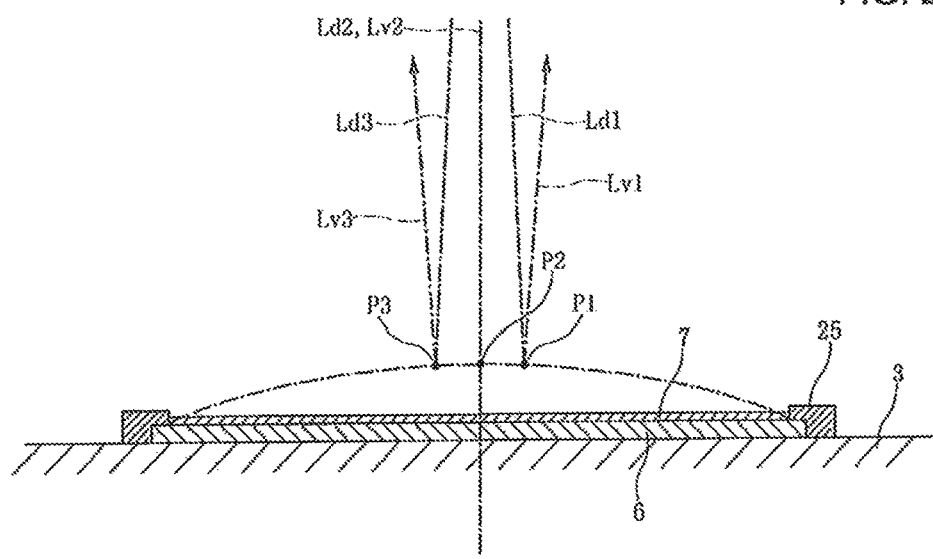

FIG. 2(b) is a side elevational view when the substrate 6 and semiconductor layer 7 illustrated in FIG. 2(a) are viewed from the side. The circular substrate 6 is held at its outer edge by a ring-like holding jig 25 and fixed on the table 3. FIG. 2(b) illustrates a state in which a warpage occurs such that the laminate of the substrate 6 and semiconductor layer 7 forms an upward convex shape.

In the state illustrated in FIG. 2 in which the substrate 6 stops without rotating, three incident points P1, P2 and P3 on the surface of the semiconductor layer 7 are irradiated with substantially three incident laser beams Ld1, Ld2 and Ld3 of which the incident direction is successively or intermittently varied by the pivot mirror 12.

The incident laser beam Ld1 is reflected at the incident point P1 to be a reflected laser beam Lv1. Similarly, the incident laser beam Ld2 is reflected at the incident point P2 to be a reflected laser beam Lv2 and the incident laser beam Ld3 is reflected at the incident point P3 to be a reflected laser beam Lv3.

When the change in an angle of the reflection direction of the reflected laser beam Lv1 with respect to the incident direction of the incident laser beam Ld1 is measured, the inclination angle of the surface of the semiconductor layer 7 can be known at the incident point P1. Similarly, when the change in an angle of the reflection direction of the reflected laser beam Lv2, Lv3 with respect to the incident direction of the incident laser beam Ld2, Ld3 is measured, the inclination angle of the surface of the semiconductor layer 7 can be known at the incident point P2, P3. Thus, given the inclination angle of the surface at each of the incident points P1, P2 and P3, it is possible to know the curvature of a certain region that includes the incident points P1, P2 and P3, that is, the curvature of a region that includes the certain point F.

When the irradiation directions of the incident laser beam are three directions and the incident points P1, P2 and P3 at three locations are irradiated with the incident laser beam, the curvature of a warpage can be measured even if the top of the warpage is located just below the first window 8 and the certain point F is located at the top of the warpage in a state in which the substrate 6 stops or only rotates around its axis. Moreover, when the incident points are set at two or more locations, preferably at three locations, on the surface of the semiconductor layer 7 formed on the substrate 6 which rotates around the axis of the table 3 while rotating around the axis of the substrate 6, the amount of information regarding the profile variation of the surface of the semiconductor layer 7 is increased and the surface profile of the film can thus be finely analyzed.

Figure 3A:
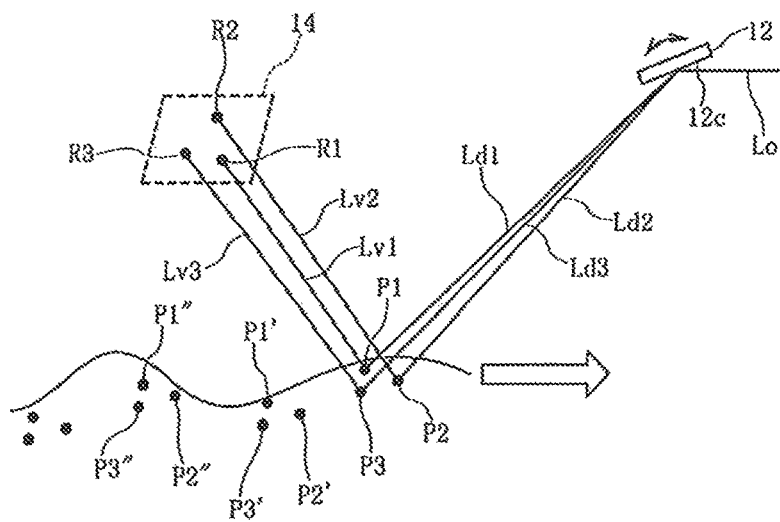
FIGS. 3(a) and 3(b) are explanatory views illustrating a principle of measuring the surface profile of a semiconductor layer using the measurement apparatus.
Figure 3B:
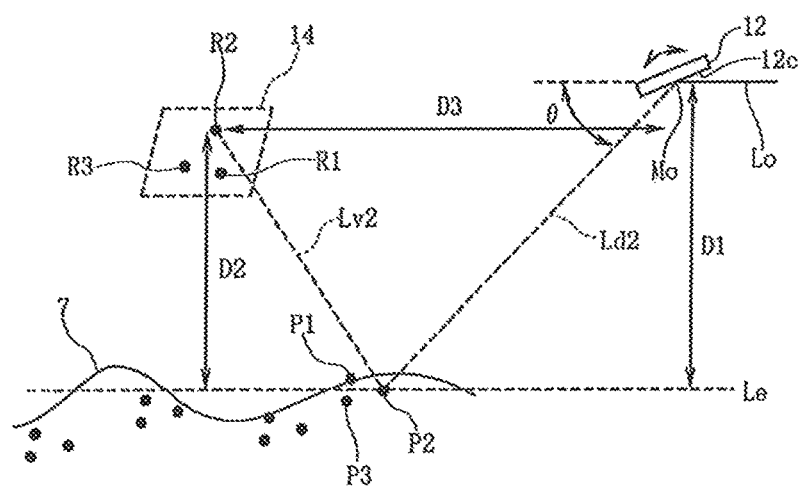

FIGS. 3(a) and 3(b) illustrate a principle of measuring the surface profile of the semiconductor layer 7 using the measurement apparatus 10. The principle of measurement will be described below with reference to a structure in which, different from FIG. 1, a beam splitter 13 is not provided, a pivot mirror 12 faces outside of a first window 8 of a chamber 2, and a beam position sensor 14 is disposed outside a second window 9. This principle of measurement applies to the measurement apparatus 10A which has the beam splitter 13 as illustrated in FIG. 1.

FIG. 3(a) schematically illustrates the structure when viewed obliquely from above the semiconductor layer 7. It is assumed that the semiconductor layer 7, which is being formed or has been formed on the substrate 6, rotates to move in the direction represented by the blank arrow.

The laser emission control unit 15 and the mirror drive control unit 16 are synchronously operated at a high speed thereby to fast switch the irradiation direction of the incident laser beams Ld1, Ld2 and Ld3, and three incident points on the surface of the semiconductor layer 7 are irradiated in turn with the laser beams which are fast switched. Assuming that, at some point of time, the incident points irradiated with the incident laser beams Ld1, Ld2 and Ld3 are P1, P2 and P3 illustrated in FIG. 3(a), the reflected laser beam Lv1 from the incident point P1 is received at a beam receiving point R1 of the beam position sensor 14. Similarly, the reflected laser beam Lv2 from the incident point P2 is received at a beam receiving point R2 of the beam position sensor 14 and the reflected laser beam Lv3 from the incident point P3 is received at a beam receiving point R3 of the beam position sensor 14.

Since the beam position sensor 14 receives the reflected laser beams Lv1, Lv2 and Lv3 sequentially at different times, the timing of acquiring data is adjusted at the beam position sensor 14 thereby to allow the detection position of each of the beam receiving points R1, R2 and R3 to be individually detected. This detection output is given to the reflected beam analyzing unit 17.

FIG. 3(b) illustrates a state in which the incident laser beam Ld2 is given to the incident point P2 on the surface of the semiconductor layer 7 and the reflected laser beam Lv2 is detected at the beam receiving point R2 of the beam position sensor 14. The deflection angle of the incident laser beam Ld at this moment is θ. Position Le represents the height level of the incident point P2 on the surface of the semiconductor layer 7. D1 represents a distance in the height direction from the incident point M0 of the laser beam L0 to the pivot mirror 12 to the above position Le. D2 represents a distance in the height direction at the beam position sensor 14 from the bean receiving point R2 to the above position Le and D3 represents a distance in the horizontal direction between the incident point M0 of the laser beam L0 to the pivot mirror 12 and the beam receiving point R2 of the beam position sensor 14.

From the information on the above deflection angle θ and the information on each of the distances D1, D2 and D3 illustrated in FIG. 3(b), the central control device 20 can know the angle of the surface of the semiconductor layer 7 at the incident point P2. Similarly, the angle of the surface of the semiconductor layer 7 can be known at the incident points P1 and P3 and the curvature of the warpage can be calculated for the region which includes the incident points P1, P2 and P3.

Figure 4:
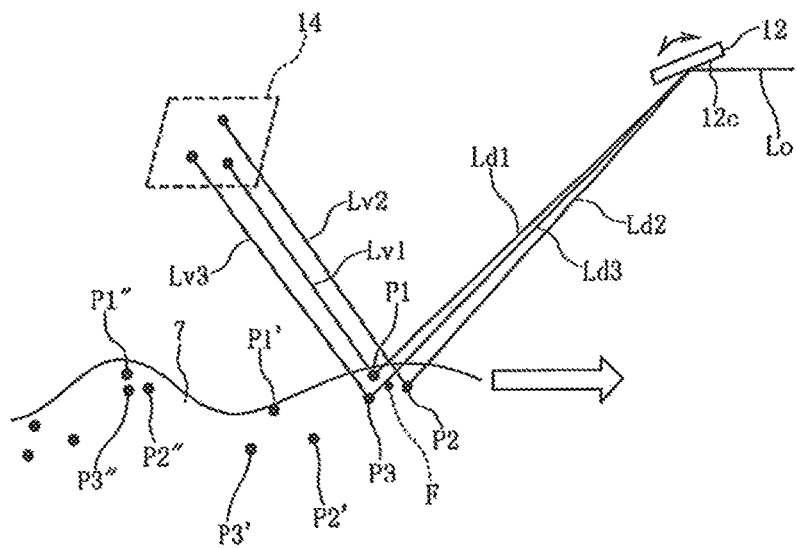
FIG. 4 is an explanatory view when varying relative angles of a plurality of incident laser beams in accordance with the surface profile of a semiconductor layer.

As illustrated in FIG. 4, as the substrate 6 and the semiconductor layer 7 move, the three incident points also move to P1', P2' and P3', and further to P1'', P2'' and P3''. Even in such situations, information regarding the reflection from the three incident points can be obtained within respective regions thereby to successively or intermittently measure the change in surface profile of the semiconductor layer 7.

As illustrated in FIG. 4, in the measurement apparatus 10 according to the present embodiment, the mirror drive control unit 16 controls the operation of the drive units 12a and 12b to vary the deflection angle (θ illustrated in FIG. 3(b)) of each of the incident laser beams Ld1, Ld2 and Ld3 which are reflected by the pivot mirror 12, so that relative angles of the incident directions of the three incident laser beams Ld1, Ld2 and Ld3 can be varied Consequently, relative positions of the incident points P1, P2 and P3 on the surface of the semiconductor layer 7 can be varied. That is, distances from the certain point F to the incident points P1, P2 and P3 can be varied.

When the surface to be irradiated with the laser beam is a flat surface, the incident points P1, P2 and P3 may preferably be located at three corners of a regular triangle. Relative angles of the incident directions of the three incident laser beams Ld1, Ld2 and Ld3 can be varied thereby to change the size of the above triangle while maintaining the similarity state. In an alternative embodiment, the size of the triangle may be varied and the triangle may be changed to a triangle other than a regular triangle.

In FIG. 4, as the semiconductor layer 7 moves in the direction of the blank arrow, positions of the incident points irradiated with the three incident laser beams Ld1, Ld2 and Ld3 move from P1, P2 and P3 to P1', P2' and P3' and further to P1'', P2'' and P3''. With regard to the size of a triangle formed by the three incident points, the triangle formed by P1', P2' and P3' is larger than that formed by P1, P2 and P3 and the triangle formed by P1'', P2'' and P3'' is smallest.

Thus, the relative angles of incident directions of the three incident laser beams Ld1, Ld2 and Ld3 may be varied to change the positions of the incident points P1, P2 and P3, or distances between the incident points, thereby to enable appropriate measurement in accordance with the curvature or the like of the surface of the film under measurement. For example, when a determination is made that the detected curvature of surface of the film is less than a predetermined value (when the surface is close to a flat surface), the central control device 20 may increase distances between the incident points P1, P2 and P3 thereby to allow the radius of curvature to be measured with a high degree of accuracy. In contrast, as the curvature of surface of the film under measurement increases, relative spread angles of the reflected laser beams Lv1, Lv2 and Lv3 increase, so that the beam position sensor 14 may not necessarily be able to detect all of the three beam receiving points R1, R2 and R3. In such cases, the distances between the incident points P1, P2 and P3 may be reduced.

In the measurement apparatus 10 according to the present embodiment, the mirror drive control unit 16 can control the drive units 12a and 12b to vary the deflection angles (incident angles) of all the incident laser beams Ld1, Ld2 and Ld3, which are directed from the pivot mirror 12 to the film surface, without varying the relative angles of the incident directions of the incident laser beams Ld1, Ld2 and Ld3. This control can vary the incident direction to the film of a virtual center line that connects between the certain point F set at the center of the incident points P1, P2 and P3 and the incident point M0 of the laser beam L0 to the pivot mirror 12, without varying the shape and size of the triangle formed by the incident points P1, P2 and P3.

Figure 5:
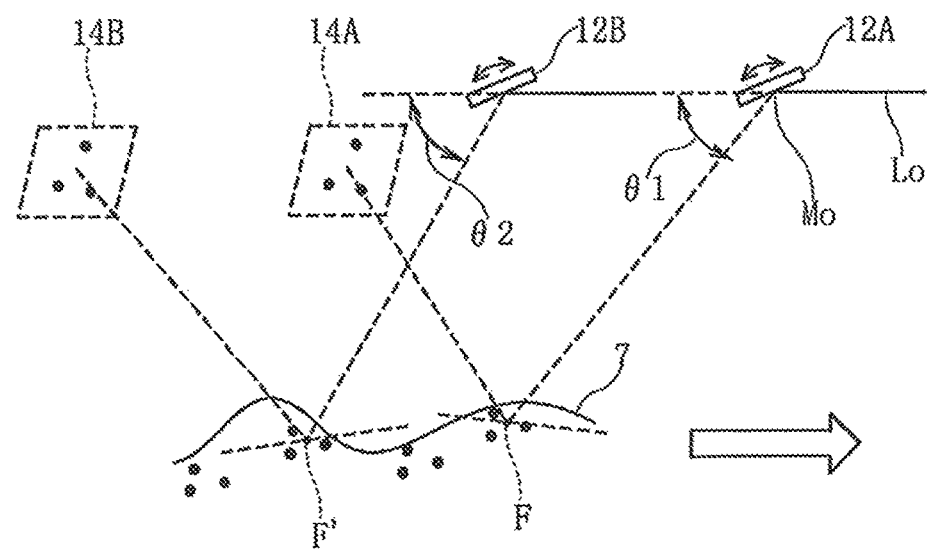
FIG. 5 is an explanatory view when varying an incident center value of respective incident laser beams in accordance with the surface profile of a semiconductor layer.

In FIG. 5, it is assumed that the substrate 6 and the semiconductor layer 7 move in the direction of the blank arrow. The position of the pivot mirror facing the semiconductor layer 7 and the position of the beam position sensor at some point of time are denoted by 12A and 14A, respectively, and those positions after the semiconductor layer 7 moves by a certain distance are denoted by 12B and 14B. When the pivot mirror is located at the position of 12A and the beam position sensor is located at the position of 14A, the average deflection angle of the incident laser beams Ld1, Ld2 and Ld3 (deflection angle of the virtual center line connecting between the incident point M0 and the certain point F) is θ1. When the pivot mirror moves to the position of 12B and the beam position sensor 14 moves to the position 14B, the average deflection angle of the incident laser beams Ld1, Ld2 and Ld3 (deflection angle of the virtual center line connecting between the incident point M0 and the certain point F') is θ2.

The curvature and inclination angle of the film surface during film formation differ in accordance with its location, and the inclination direction of the film surface at which the incident points P1, P2 and P3 are set varies constantly. Depending on the degree of this inclination, all of the reflected laser beams Lv1, Lv2 and Lv3 may not necessarily be able to transmit through the second window 9 and/or the beam position sensor 14 may not necessarily be able to receive all of the reflected laser beams Lv1, Lv2 and Lv3. To deal with this problem, the direction of the pivot mirror 12 is varied to change the incident direction of the virtual center line connecting between the incident point M0 and the certain point F, F'. This operation enables control such that all of the reflected laser beams Lv1, Lv2 and Lv3 can transmit through the second window 9 and the beam position sensor 14 can receive all of the reflected laser beams Lv1, Lv2 and Lv3.

Figure 6:
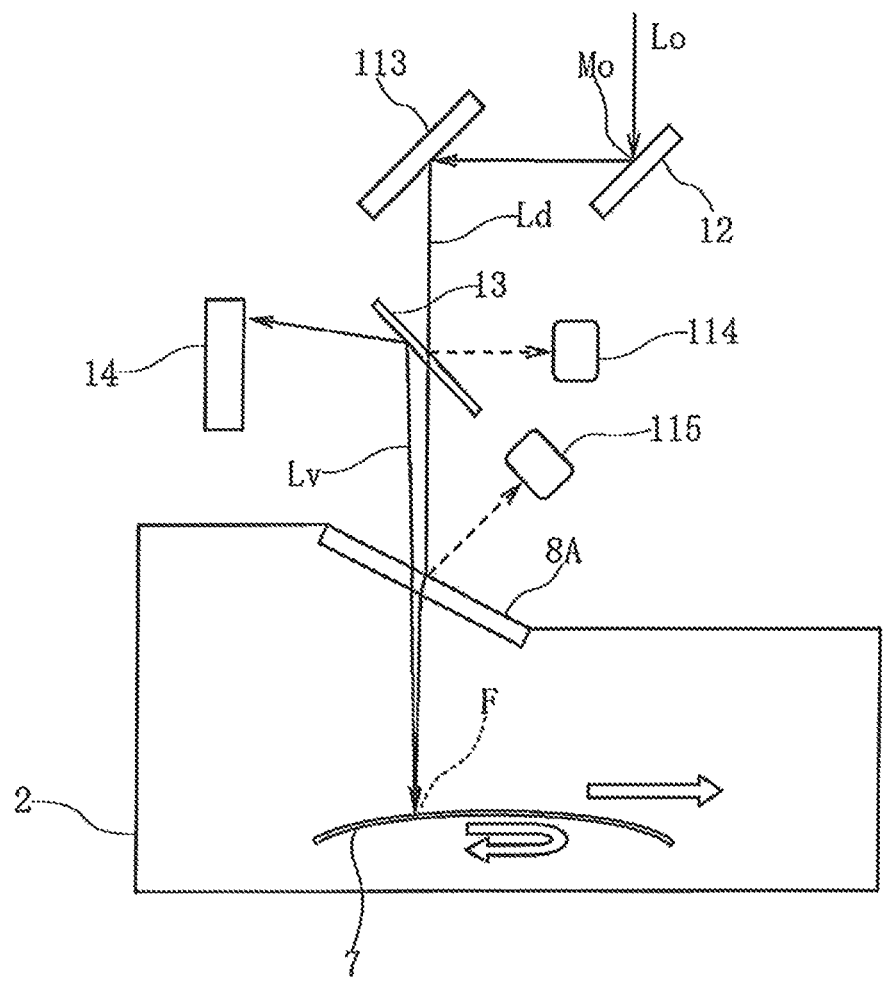
FIG. 6 is an explanatory view illustrating a further specific embodiment for describing the measurement method and measurement apparatus according to the present invention.

FIG. 6 illustrates a further specific embodiment that represents the method and apparatus for measuring a surface profile according to the present invention.

In the embodiment illustrated in FIG. 6, the laser beam L0 emitted from the light-emitting device 11 is reflected by a pivot mirror 12 and a second mirror 113, transmits through a beam splitter 13 and a transparent plate 8A such as a glass plate fitted in a first window 8, and is given to the surface of a semiconductor layer 7 in a chamber 2.

The pivot mirror 12, or a first mirror, is driven by drive units 12a and 12b as illustrated in FIG. 1 and operates to vary the direction of the laser beam L0 so that three incident laser beams Ld1, Ld2 and Ld3 are incident to the film. The second mirror 113 is to vary the directions of the three incident laser beams Ld1, Ld2 and Ld3 toward the surface of the film. That is, the second mirror 113 is to vary the incident direction to a certain point F that is set on the surface of the film. Providing the second mirror 113 can simplify the operation control for the pivot mirror 12 because it suffices for the pivot mirror 12 to operate to convert the direction of the laser beam L0 into the directions of the three incident laser beams Ld1, Ld2 and Ld3.

The direction of the second mirror 113 may be manually varied or may also be controlled to vary constantly, such as using an electromagnetic actuator having coils and magnets. In such cases, the pivot mirror 12 is operated at a high speed so that the laser beam L0 is successively or intermittently changed to the three incident laser beams Ld1, Ld2 and Ld3 while the second mirror 113 is operated at a relatively low speed so as to respond to the variation of direction of the film surface.

In the present embodiment, a light-absorbing member 114 is provided to prevent further reflection of a reflected component of the incident laser beam Ld that was not able to transmit through the beam splitter 13, and a light-absorbing member 115 is provided to prevent reflection of a light component that returns from the chamber 2 and is deflected at the transparent plate 8A. Each of the light-absorbing members 114 and 115 is formed to have a light-absorbing color such as black color or configured to have a diffuse reflection surface that irregularly reflects light.

As the above, the angle variation of the reflected laser beam from each of the plurality of incident points can be detected to constantly measure the surface profile of the semiconductor layer 7. Through this measurement, the central control device 20 may control the material gas control unit 21 to vary the material gas supplied into the chamber 2 and/or vary the supply amount of the material gas, and the warpage of the surface profile of the substrate 6 and semiconductor layer 7 can thereby be corrected in real time.

The measurement apparatus 10A according to the above embodiment can vary the emission timing of the laser beam L0 and the direction of the reflection surface 12c of the pivot mirror 12 thereby to further change the number of the incident laser beam or beams to one, two and four or more, and optimum profile measurement can therefore be realized in accordance with the type or profile of a film to be measured. In an alternative embodiment, the emission timing of the laser beam L0 and the direction of the reflection surface 12c of the pivot mirror 12 may be varied so that triangles formed by the incident points P1, P2 and P3 can be concurrently set at a plurality of locations, in an alternative embodiment, when the positions to which the reflected laser beams Lv return are spread, a plurality of beam position sensors 14 may be arranged next to one another.

DESCRIPTION OF REFERENCE NUMERALS

1 Film forming apparatus
2 Chamber
3 Table
6 Substrate
7 Semiconductor layer
8 First window
9 Second window
10A Measurement apparatus
10B Circuit unit
11 Light-emitting device
12 Pivot mirror (First mirror)
12a, 12b Drive unit
13 Beam splitter
14 Beam position sensor
15 Laser emission control unit
16 Mirror drive control unit
17 Reflected beam analyzing unit
20 Central control device
21 Material gas control unit
113 Second mirror
Ld1, Ld2, Ld3 incident laser beam
Lv1, Lv2, Lv3 Reflected laser beam
P1, P2, P3 Incident point

The invention claimed is:

1. A method for measuring a surface profile of a film growing on a surface of a substrate in a chamber, the method comprising:
   successively or intermittently varying an angle of a mirror by pivoting, so that the mirror sequentially gives a single laser beam to yield three or more irradiation points relative to a predefined point on a surface of the film or on the surface of the substrate while varying an incident direction of the single laser beam, wherein the three or more irradiation points being vertices of a formed triangle containing the predefined point on the surface of the film or on the surface of the substrate;
   detecting a reflection direction of the single laser beam using a beam position sensor;
   calculating, from the reflection direction, an angle of inclination of the surface at each of the three or more irradiation points and a warpage of the surface within a region including the predefined point and the three or more irradiation points.

2. The method for measuring a surface profile as recited in claim 1, wherein an irradiation timing of the laser beam and a reflection angle of the mirror are controlled at a defined speed to vary the incident direction of the laser beam to the surface of the film.

3. The method for measuring a surface profile as recited in claim 2, wherein the relative distances between the three or more irradiation points on the surface or the respective distances from the predefined point to the plurality of irradiation points are varied.

4. The method for measuring a surface profile as recited in claim 3, wherein the relative or respective distances are varied to correspond to the calculated warpage of the surface of the film or the surface of the substrate.

5. The method for measuring a surface profile as recited in claim 3, wherein the relative or respective distances are varied to correspond to a calculated curvature of the surface of the film or the surface of the substrate.

6. The method for measuring a surface profile as recited in claim 1, wherein an angle of the mirror is controlled to vary an incident angle toward the predefined point so that the beam position sensor can receive all of the laser beams reflected from the three or more irradiation points.

7. The method for measuring a surface profile as recited in claim 6, wherein the mirror comprises a first mirror and a second mirror that are configured to direct the laser beam toward the surface of the film, wherein the first mirror gives the laser beam to the three or more irradiation points around the predefined point and the second mirror varies the incident angle toward the predefined point.

8. An apparatus for measuring a surface profile of a film growing on a surface of a substrate in a chamber, the apparatus comprising:
- a light-emitting device configured to give a single laser beam;
- a mirror configured to reflect the laser beam toward the surface of the film; and
- a pivoting structure configured to vary a reflection direction of the mirror by pivoting, wherein an angle of the mirror is successively or intermittently varied so that the mirror sequentially gives the single laser beam to yield three or more irradiation points relative to a predefined point on a surface of the film or on the surface of the substrate while varying an incident direction of the single laser beam, wherein the three or more irradiation points being vertices of a formed triangle containing the predefined point on the surface of the film or on the surface of the substrate;
- wherein the apparatus further comprises a beam position sensor disposed on optical paths of laser beams reflected from respective incident points, wherein the beam position sensor detects reflection directions of the laser beams, wherein an angle of inclination of the surface at each of the three or more irradiation points is detected from the single laser beam reflected from each of the three or more irradiation points and a warpage of the surface within a region including the predefined point and the three or more irradiation points is calculated from the angle of inclination.

9. The apparatus for measuring a surface profile as recited in claim 8, wherein an irradiation timing of the laser beam and a reflection angle of the mirror are controlled at a defined speed to vary relative distances between the three or more irradiation points on the surface or respective distances from the predefined point to the three or more irradiation points.

10. The apparatus for measuring a surface profile as recited in claim 9, wherein the relative or respective distances are varied to correspond to calculated warpage of the surface of the film or the surface of the substrate or to correspond to a calculated curvature of the surface.

* * * * *